US012568832B2

(12) United States Patent
Black et al.

(10) Patent No.: US 12,568,832 B2
(45) Date of Patent: Mar. 3, 2026

(54) THROUGH PACKAGE VERTICAL INTERCONNECT AND METHOD OF MAKING SAME

(71) Applicant: Chipletz, Inc., Spicewood, TX (US)

(72) Inventors: Bryan Black, Spicewood, TX (US); Siddharth Ravichandran, Austin, TX (US); Michael Su, Austin, TX (US); Michael Alfano, Austin, TX (US)

(73) Assignee: Chipletz, Inc., Spicewood, TX (US)

( * ) Notice: Subject to any disclaimer, the term of this patent is extended or adjusted under 35 U.S.C. 154(b) by 0 days.

(21) Appl. No.: 19/238,914

(22) Filed: Jun. 16, 2025

(65) Prior Publication Data

US 2025/0309082 A1     Oct. 2, 2025

Related U.S. Application Data

(62) Division of application No. 18/138,050, filed on Apr. 22, 2023.

(60) Provisional application No. 63/334,449, filed on Apr. 25, 2022.

(51) Int. Cl.
| | |
|---|---|
| *H01L 23/498* | (2006.01) |
| *H01L 21/48* | (2006.01) |
| *H01L 21/768* | (2006.01) |
| *H01L 23/48* | (2006.01) |
| *H05K 1/11* | (2006.01) |
| *H05K 3/42* | (2006.01) |

(52) U.S. Cl.
CPC .. *H01L 23/49827* (2013.01); *H01L 21/76898* (2013.01); *H01L 23/481* (2013.01); *H05K 1/115* (2013.01); *H05K 3/429* (2013.01); *H05K 2201/09563* (2013.01)

(58) Field of Classification Search
CPC ......... H01L 23/49827; H01L 21/76898; H01L 23/481; H05K 1/115; H05K 3/429; H05K 2201/09563
See application file for complete search history.

(56) References Cited

U.S. PATENT DOCUMENTS

| | | | | |
|---|---|---|---|---|
| 2006/0118965 A1* | 6/2006 | Matsui | ................. | H01L 23/481 |
| | | | | 257/774 |
| 2007/0020914 A1* | 1/2007 | Higashi | ............. | H01L 23/49822 |
| | | | | 257/E23.008 |
| 2012/0252164 A1* | 10/2012 | Nakao | ................... | H01L 23/481 |
| | | | | 438/107 |

* cited by examiner

*Primary Examiner* — Herve-Louis Y Assouman
(74) *Attorney, Agent, or Firm* — Artie Pennington Law Offices, PLLC; Artie Pennington; Jeffrey Van Myers

(57) ABSTRACT

In integrated circuit packages, a coaxial pair of signals are routed through a plated through hole between circuitry on one face of the core substrate material with circuitry on an opposing face of the core substrate material. Provided are methods and apparatuses where signals are routed within a concentric reference conductor within traditional package substrates. Methods for forming a hole in the core substrate material through which the coaxial pair of signals is passed on a fine pitch.

5 Claims, 7 Drawing Sheets

Cut-away side view

Cut-away side view                                        Top-down view

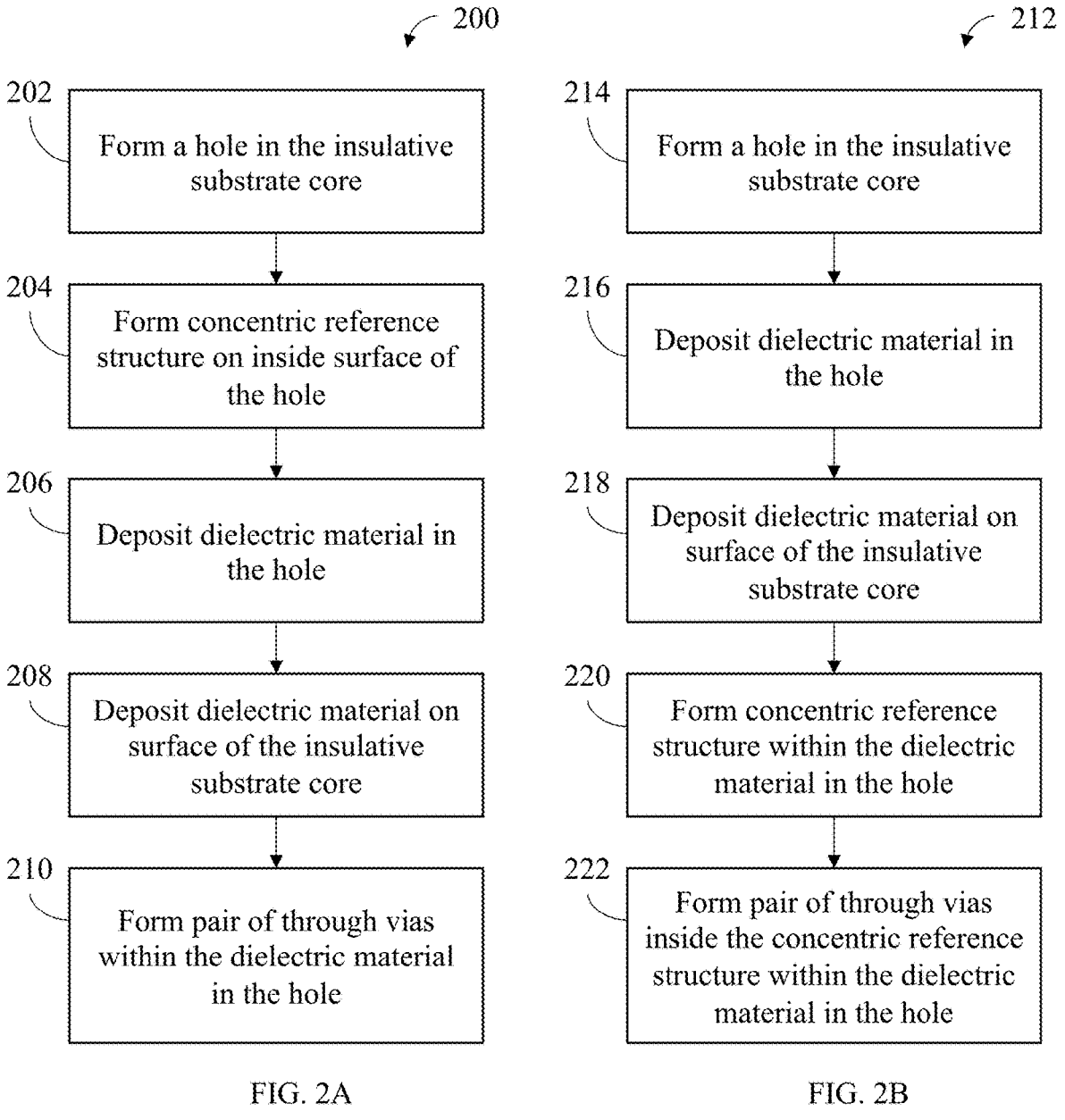

200

202 — Form a hole in the insulative substrate core

204 — Form concentric reference structure on inside surface of the hole

206 — Deposit dielectric material in the hole

208 — Deposit dielectric material on surface of the insulative substrate core

210 — Form pair of through vias within the dielectric material in the hole

214 — Form a hole in the insulative substrate core

216 — Deposit dielectric material in the hole

218 — Deposit dielectric material on surface of the insulative substrate core

220 — Form concentric reference structure within the dielectric material in the hole 222 — Form pair of through vias inside the concentric reference structure within the dielectric material in the hole

FIG. 2B

Cut-away side view

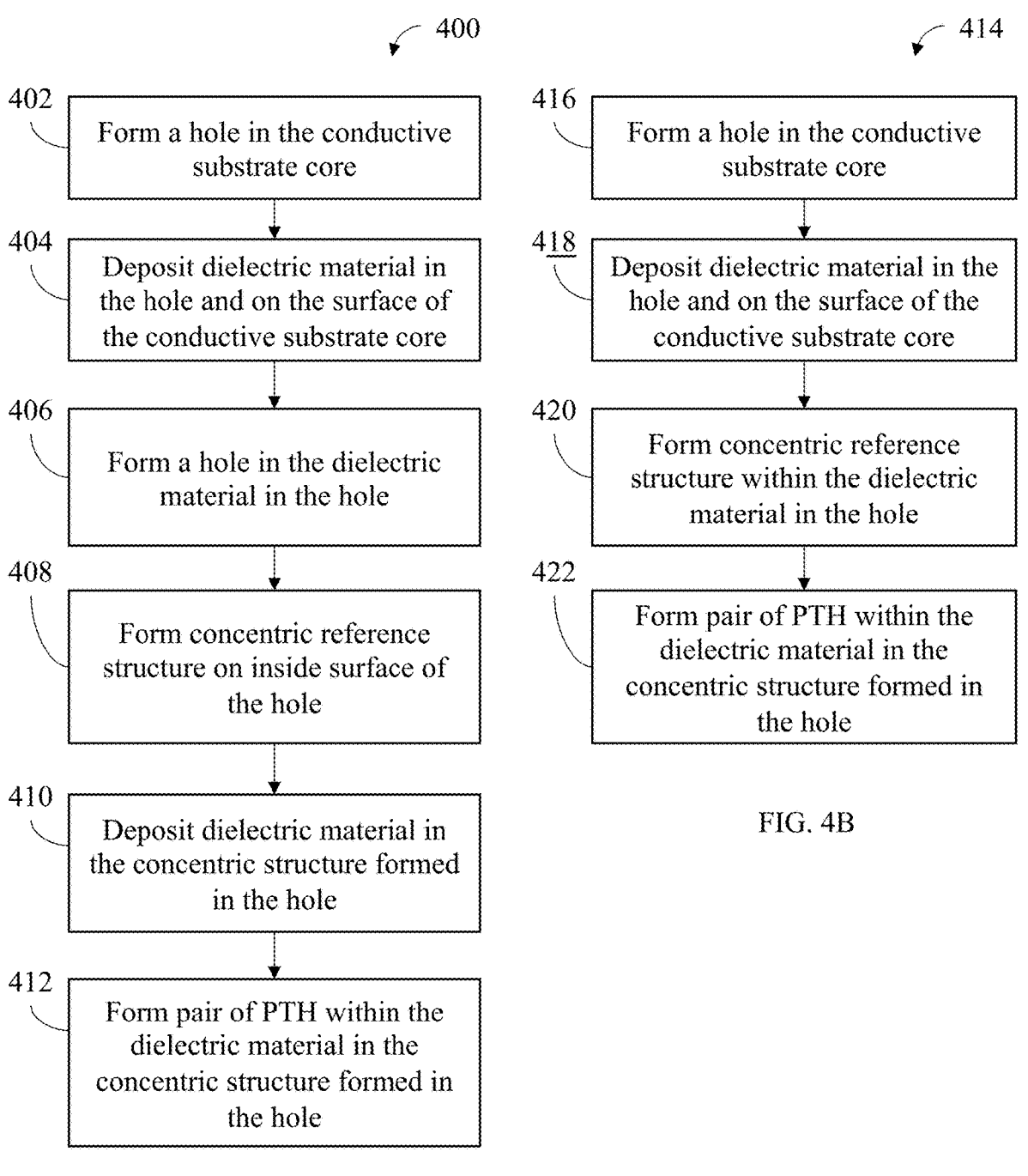

400

402 — Form a hole in the conductive substrate core

404 — Deposit dielectric material in the hole and on the surface of the conductive substrate core 406 — Form a hole in the dielectric material in the hole 408 — Form concentric reference structure on inside surface of the hole 410 — Deposit dielectric material in the concentric structure formed in the hole 412 — Form pair of PTH within the dielectric material in the concentric structure formed in the hole

416 — Form a hole in the conductive substrate core

418 — Deposit dielectric material in the hole and on the surface of the conductive substrate core 420 — Form concentric reference structure within the dielectric material in the hole 422 — Form pair of PTH within the dielectric material in the concentric structure formed in the hole

FIG. 4B

Cut-away side view

502

504    506

502

508

502

600

602   Form a hole in the conductive substrate core

604   Deposit dielectric material in the hole and on the surface of the conductive substrate core 606   Form pair of PTH within the dielectric material in the hole

700

706

708

702

704

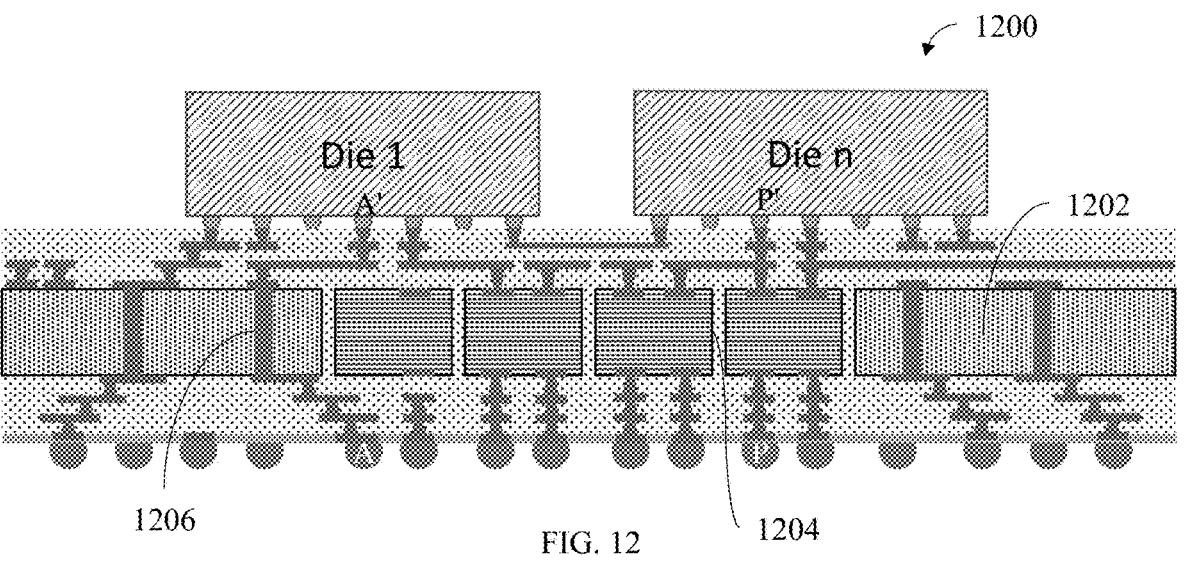
1200
1202
1206          FIG. 12          1204
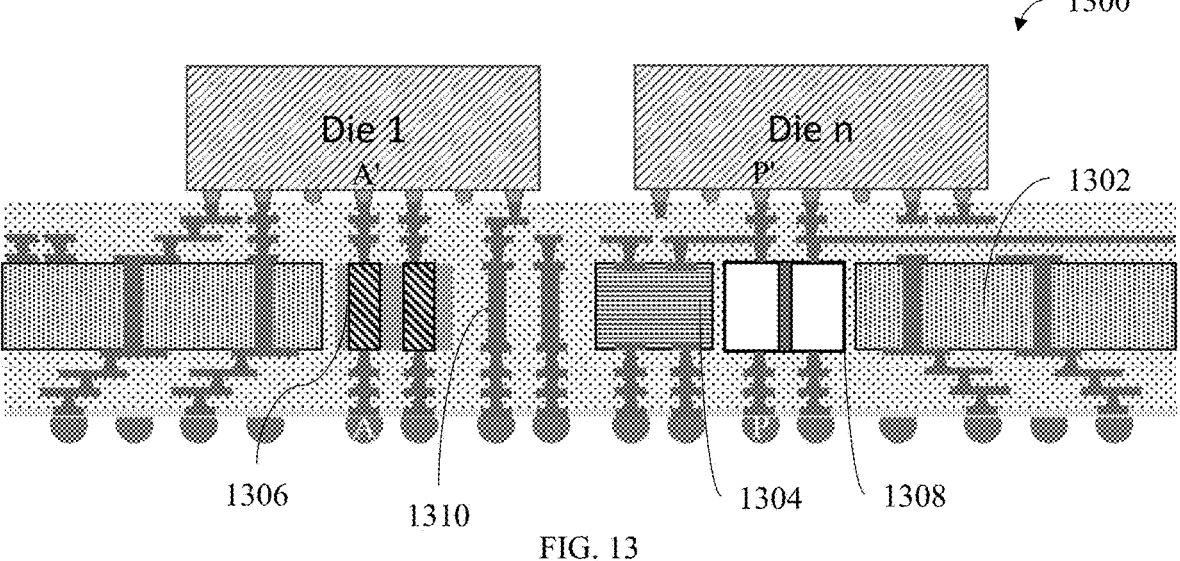
1300
1302
1306          1304     1308
1310
FIG. 13

THROUGH PACKAGE VERTICAL INTERCONNECT AND METHOD OF MAKING SAME

CROSS-REFERENCE TO RELATED APPLICATIONS

This application is related to the following:
1. Provisional Application Ser. No. 63/334,449, filed 25 Apr. 2022 ("Parent Provisional"); and
2. U.S. application Ser. No. 18/138,050, filed 22 Apr. 2023 ("Parent Application").
This application is:
1. a Divisional Application of the Parent Application;
2, which in turn claims priority to the Parent Provisional.
This application claims priority to:
1. the Parent Application; and
2. the Parent Provisional;
collectively, "Priority References", and hereby claims benefit of the filing date thereof pursuant to 37 C.F.R. § 1.78 (a).

The subject matter of the Priority References, each in their respective entirety, are each expressly incorporated herein by reference.

BACKGROUND

Field of Invention

Embodiments of the present invention are directed to semiconductor packaging and, more particularly, to improve performance and reduce area by utilizing a coaxial approach where signals are routed within a concentric reference conductor within traditional package substrates.

Description of Related Art

Integrated circuit ("IC") substrate or IC package substrate may be a basic material used in advanced packaging applications used to package bare IC chips. IC substrate may act as the connection between IC chip and PCB through a conductive network of wires and holes. IC packaging substrate has been developed over the years on the basis of Higher Density Interconnect ("HDI")/Built Up Multilayer ("BUM") board; IC packaging substrate is HDI/BUM board with higher densities. An IC substrate may be a pattern of conductors that corresponds to the wiring of an electronic circuit formed on one or more layers of insulative material. The IC substrate includes electrical traces that are routed on or through the various layers of the substrate. IC substrate also include through package vertical interconnect or plated through holes ("PTH") which are solid electrical paths connecting one layer to another layer. Traditionally, package substrates use PTH to conduct I/O signals or voltage supply through the substrate core. However, the performance and area occupied by the PTHs is largely determined by the PTH-PTH pitch. This also impacts the ground separation.

What is needed is an improved method and apparatus for use in semiconductor packaging substrates, and in particular to improve the performance and reduce the area utilized by PTHs in semiconductor packaging substrates by utilizing a coaxial approach where signals are routed within a concentric reference conductor within traditional package substrates. In particular, we submit that such a method and apparatus should provide performance generally comparable to the best prior art techniques but more efficiently than known implementations of such prior art techniques.

SUMMARY OF THE INVENTION

According to one embodiment, a method of forming a coaxial structure, the coaxial structure comprising a concentric reference structure and a first and second through-via formed therein, in an insulative semiconductor substrate core, the method comprising the steps of: forming a hole in the insulative semiconductor substrate core, the hole having an inner surface from a first side of the insulative semiconductor substrate core to a second side of the insulative semiconductor substrate core; depositing over the inner surface of the hole in the insulative semiconductor substrate a conductive material to form the concentric reference structure from the first side of the insulative semiconductor substrate core to the second side of the insulative semiconductor substrate core through the hole; depositing a first dielectric material in the hole; depositing a second dielectric material on the surface of the first and second sides of the insulative semiconductor substrate core; forming the first and second through-via through the second dielectric material on the first and second sides of the insulative semiconductor substrate core and within the first dielectric material in the hole.

According to a different embodiment, a method for forming a coaxial structure, the coaxial structure comprising a concentric reference structure and a first and second through via formed therein, in a conductive semiconductor substrate core, the method comprising the steps of: forming a first hole in the conductive semiconductor substrate core, the first hole having an inner surface from a first side of the conductive semiconductor substrate core to a second side of the conductive semiconductor substrate core; depositing a first dielectric material in the first hole; forming a second hole within the dielectric material deposited in the first hole; depositing over the inner surface of the second hole in the conductive semiconductor substrate a conductive material to form the concentric reference structure from the first side of the conductive semiconductor substrate core to the second side of the conductive semiconductor substrate core through the second hole; depositing a second dielectric material in the second hole; forming a first and second through vias within the second dielectric material in the second hole.

According to a yet a different embodiment, a packaging substrate core comprising: a substrate comprising: a first surface; a cavity formed into the first surface to a depth less than the thickness of the insulating substrate; an active component disposed the cavity; and a vertical interconnect module disposed within the cavity.

BRIEF DESCRIPTION OF DRAWINGS

FIG. 2A illustrates, in flow chart form, a fabrication process of an insulating semiconductor substrate core having a coaxial structure that includes a concentric reference structure and a pair of signal PTH formed therein, in accordance with at least one embodiment;

FIG. 2B illustrates, in flow chart form, another fabrication process of an insulating semiconductor substrate core having a coaxial structure that includes a concentric reference structure and a pair of signal PTH formed therein, in accordance with at least one embodiment;

FIG. 4A illustrates, in flow chart form, a fabrication process of a conductive semiconductor substrate core having a coaxial structure that includes a concentric reference structure and a pair of signal PTH formed therein, in accordance with at least one embodiment;

FIG. 4B illustrates, in flow chart form, another fabrication process of a conductive semiconductor substrate core having a coaxial structure that includes a concentric reference structure and a pair of signal PTH formed therein, in accordance with at least one embodiment;

FIG. 12 illustrates, in diagrammatic form, a cut-away side view of a traditional package substrate with die mounted atop the substrate, ball connectors on the bottom of the substrate, and devices embedded within the core of the substrate; and FIG. 13 illustrates, in diagrammatic form, a cut-away side view of a package substrate with die mounted atop the substrate, ball connectors on the bottom of the substrate, and adapted to utilize at least a vertical interconnect module or a conductive slug module, in accordance with at least one embodiment.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Traditional package substrates use single plated through holes (PTHs) to conduct IO signals or voltage supply through the substrate core. The performance and area occupied by these PTHs is largely determined by the PTH-PTH pitch (which also determines the ground separation). In accordance with at least one embodiment, the structure improves performance and reduces area by utilizing a coaxial approach where signals are routed within a concentric reference conductor. The coax structure could be formed in same layer, or in 2 different layers. PTH may be fully or partially filled. The PTH hole fill material can be the same or different material than the buildup material. The core could be insulating or conducting (where the conductive core could be used as reference conductor).

Figure 1:
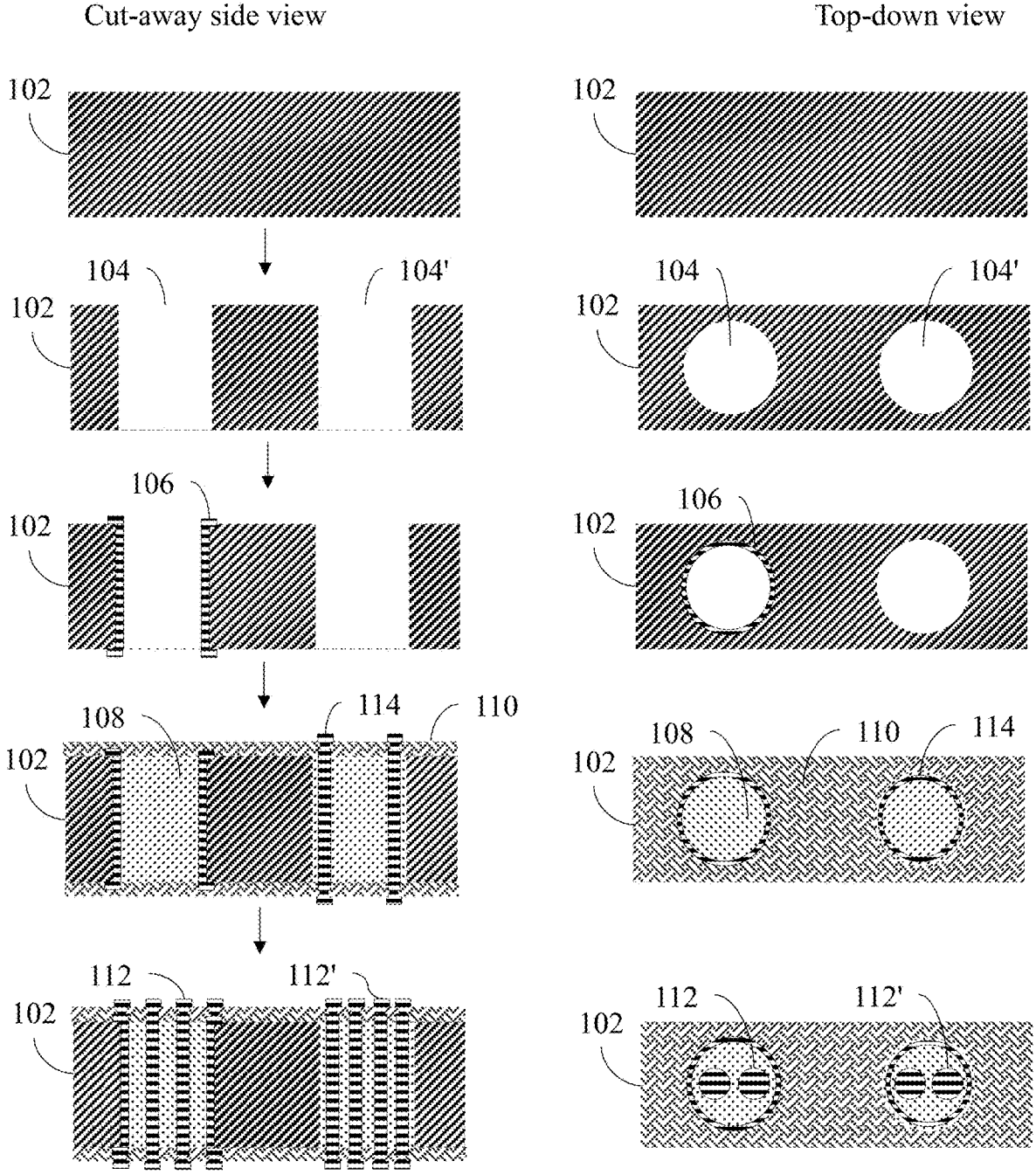
FIG. 1 illustrates, in diagrammatic form, a cut-away side view and a top-down view of a fabrication process of an insulating semiconductor substrate core having a coaxial structure that includes a concentric reference structure and a pair of signal PTH formed therein, in accordance with at least one embodiment.

FIG. 1 illustrates, in diagrammatic form, a cut-away side view and a top-down view of a fabrication process of an insulating semiconductor substrate core having a coaxial structure that includes a concentric reference structure and a pair of signal through vias, i.e., PTHs, formed therein, in accordance with at least one embodiment. In FIG. 1, a hole 104 is formed in the insulating substrate core 102. Formation of the hole 104 may take place through the use of a device which may include a mechanical means, such as a mechanical drill, or an electromagnetic device, such as a laser for ablating substrate material. The hole 104 through the insulating substrate core 102 may be further formed by way of a chemical etching process, such as a plasma etching process, the specifics of which are appreciated by those of ordinary skill in the art and are not further described herein. The hole 104 has an inner surface spanning from one side of the insulating substrate core 102 to the opposite side of the insulating substrate core 102. As further illustrated in FIG. 1, following the formation of the hole 104 in the insulating substrate core 102, a concentric reference structure 106 is formed using conductive material within the hole 104, the specifics of which are appreciated by those of ordinary skill in the art. The conductive material may be deposited using industry standard techniques such as physical vapor deposition ("PVD"), also known as sputtering, electrochemical deposition ("ECD"), conductive ink-fill techniques for metals, and similar well understood techniques such as electro plating. The concentric reference structure 106 is deposited on the inner surface of the hole 104, covering the inner surface of the hole 104 from one side of the insulating substrate core 102 to the opposite side of the insulating substrate core 102.

Further illustrated in FIG. 1, a dielectric material 108 is used to fill the hole 104 containing the concentric reference structure 106. Dielectric material 108 is typically a material having a low permittivity that is more easily drilled through laser drilling methods than materials such as glass fiber reinforced epoxy resins and is deposited in the hole using standard packaging techniques, such as for example, squeegee printing or stencil printing with squeegee. The upper and lower surfaces of the insulating substrate core 102 are also laminated using a dielectric or insulative material. This dielectric or insulative material may be the same as the dielectric material 108 used to fill hole 104, or it may be of a different composition. This dielectric or insulative material is illustrated in FIG. 1 as dielectric laminate 110. FIG. 1 also illustrates, a pair of holes are then formed through the dielectric laminate 110 and through the dielectric material 108 used to fill hole 104 using processes well understood such as mechanical drilling processes or laser drilling processes, depending on the dimensions of the hole to be created. The second pair of holes are co-axially aligned with the hole 104 and with each other. Conductive material is deposited in the pair of holes, forming a first and second through via and having been formed co-axially aligned with hole 104 through the dielectric laminate 110 and the dielectric material 108 used to fill hole 104, and capped with the same conductive material to form the PTH 112. Capping typically is done as part of a patterning process. Conducting materials include metals such as copper, aluminum, and tungsten. The conducting material may be deposited, by way of example, in the hole for PTH 112 by PVD, ECD, or electrical plating, for example.

FIG. 1 also illustrates, in diagrammatic form, a cut-away side view and a top-down view of a fabrication process of an insulating semiconductor substrate core having a coaxial structure that includes a concentric reference structure and a pair of signal through vias, i.e., PTHs, formed therein, in accordance with at least one embodiment. In FIG. 1, a hole 104' is formed in the insulating substrate core 102. Formation of the hole 104' may take place through the use of a device which may include a mechanical means, such as a mechanical drill, or an electromagnetic device, such as a laser for ablating substrate material. The hole 104' through the insulating substrate core 102 may be further formed by way of a chemical etching process, such as a plasma etching process, the specifics of which are appreciated by those of ordinary skill in the art and are not further described herein. The hole 104' has an inner surface spanning from one side of the insulating substrate core 102 to the opposite side of the insulating substrate core 102. As further illustrated in FIG. 1, following the formation of the hole 104' in the insulating substrate core 102, a dielectric material 108 is used to fill the hole 104'. Dielectric material 108 is typically a material having a low permittivity that is more easily drilled through laser drilling methods than materials such as glass fiber reinforced epoxy resins and is deposited in the hole using standard packaging techniques, such as for example, squeegee printing or stencil printing with squeegee. The upper and lower surfaces of the insulating substrate core 102 are also laminated using a dielectric or insulative material. This dielectric or insulative material may be the same as the dielectric material 108 used to fill hole 104', or it may be of a different composition. This dielectric or insulative material is illustrated in FIG. 1 as dielectric laminate 110.

Following the deposition of the dielectric material 108 into hole 104' and the deposition of the dielectric laminate 110, the concentric reference structure 114 is created by forming the ring, doughnut, semicircle, or holes through the dielectric laminate 110 and through the dielectric material 108 used to fill hole 104'. The concentric reference structure is by depositing conductive material within the ring, etc., industry standard techniques such as physical vapor deposition ("PVD"), also known as sputtering, electrochemical deposition ("ECD"), conductive ink-fill techniques for metals, and similar well understood techniques such as electro plating. Subsequent to forming the concentric reference structure 114, FIG. 1 also illustrates, a pair of holes are then formed through the dielectric laminate 110 and through the dielectric material 108 used to fill hole 104' using processes well understood such as mechanical drilling processes or laser drilling processes, depending on the dimensions of the hole to be created. The second pair of holes are co-axially aligned with the hole 104' and the concentric reference structure 114, as well as with each other. Conductive material is deposited in the pair of holes having been formed co-axially aligned with hole 104' through the dielectric laminate 110 and the dielectric material 108 used to fill hole 104', and capped with the same conductive material to form the through vias, i.e., PTHs 112. Capping typically is done as part of a patterning process. Conducting materials include metals such as copper, aluminum, and tungsten. The conducting material may be deposited, by way of example, in the hole for PTH 112 by PVD, ECD, or electrical plating, for example.

FIG. 2A illustrates, in flow chart form, a fabrication process 200 of an insulating semiconductor substrate core having a coaxial structure that includes a concentric reference structure and a pair of signal through vias, i.e., PTHs, formed therein, in accordance with at least one embodiment. In FIG. 2A, box 202, a insulative semiconductor substrate core is provided and one or more holes are formed through the insulative semiconductor substrate core. A conductive material is then deposited over the inside surface of the hole or holes forming the concentric reference structure on the inside surface of the hole or holes (box 204). A dielectric material is then deposited into the plated hole (box 206). A dielectric material is next deposited on the surfaces of the insulative semiconductor substrate core (box 208). A pair of coaxially aligned holes are then formed through the dielectric plug. Metal is deposited into the holes using industry standard techniques such as PVD and ECD techniques for metals, and a coaxial pair of through vias, i.e., PTHs, is thus formed within the dielectric plug in the hole (box 210).

FIG. 2B illustrates, in flow chart form, a fabrication process 212 of an insulating semiconductor substrate core having a a coaxial structure that includes a concentric reference structure and a pair of signal through vias, i.e., PTH formed therein, in accordance with at least one embodiment. In FIG. 2B, box 214, an insulative semiconductor substrate core is provided and one or more holes are formed through the insulative semiconductor substrate core. A dielectric material is then deposited into the hole (box 216). A dielectric material is next deposited on the surfaces of the insulative semiconductor substrate core (box 218). A concentric reference structure is then formed through the dielectric material deposited in the hole (box 220). A pair of coaxially aligned holes are then formed through the dielectric plug. Metal is deposited into these holes forming the through vias, or PTHs, using industry standard techniques discussed above (box 222).

Figures 3, 9, 10:
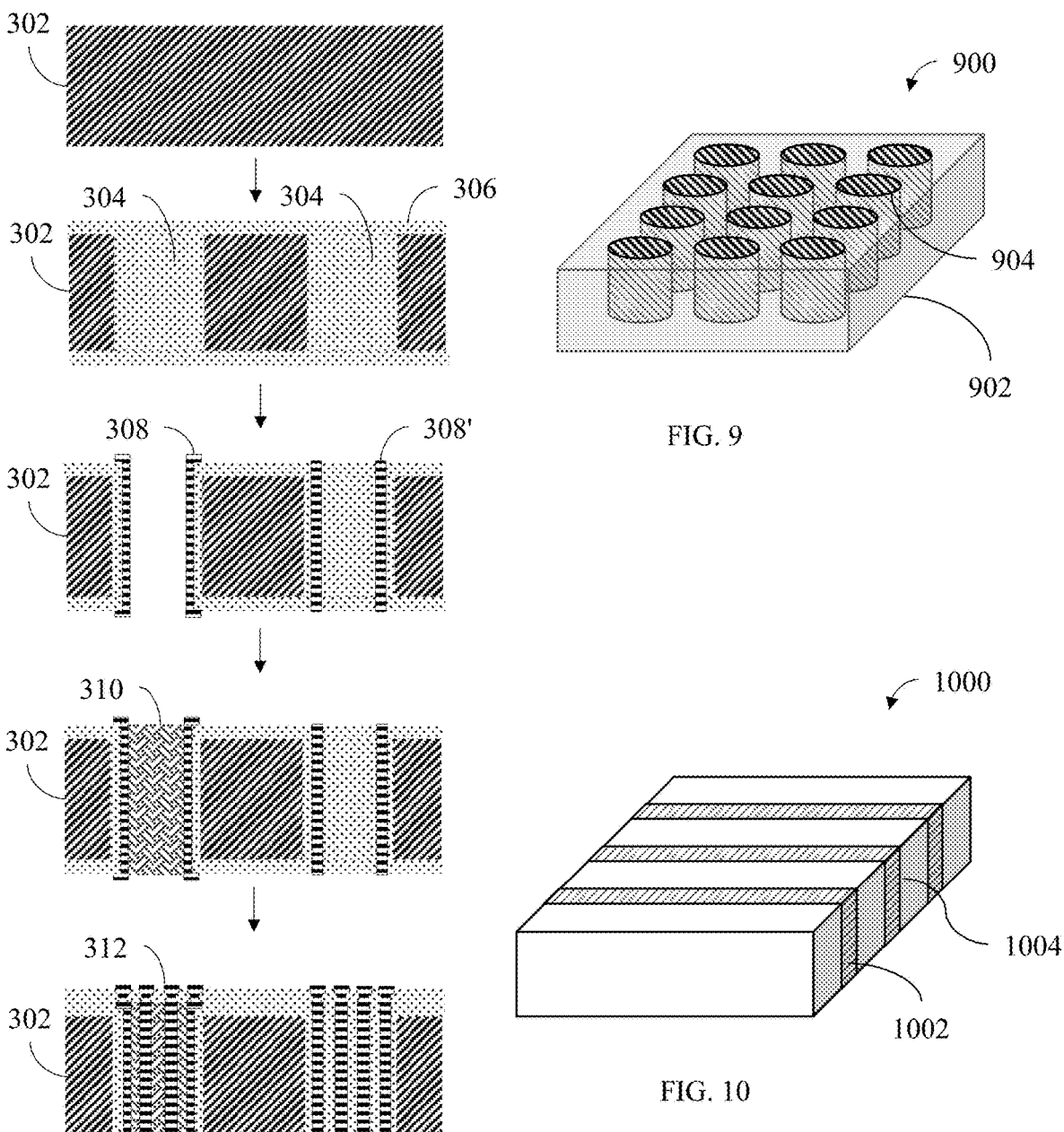
FIG. 3 illustrates, in diagram form, a cut-away side view of a fabrication process of a conductive semiconductor substrate core having a coaxial structure that includes a concentric reference structure and a pair of signal PTH formed therein, in accordance with at least one embodiment.
FIG. 9 illustrates, in diagram form, a vertical interconnect module for use in a semiconductors substrate core having a PTH region formed therein, in accordance with at least one embodiment.
FIG. 10 illustrates, in diagram form, a conductive slug module for use in a semiconductors substrate core having a conductive slug region formed therein, in accordance with at least one embodiment.

FIG. 3 illustrates, in diagram form, a cut-away side view of a fabrication process of a conductive semiconductor substrate core having a coaxial structure that includes a concentric reference structure and a pair of signal PTH formed therein, in accordance with at least one embodiment. In FIG. 3, one or more hole(s) 304 is formed in the conductive semiconductor substrate core 302. The hole 304 has an inner surface spanning from one side of the conductive semiconductor substrate core 302 to the opposite side of the conductive semiconductor substrate core 302. Dielectric material 306 is then deposited both in the hole 304 and on the surface of the conductive semiconductor substrate core 302. A hole is then formed through the dielectric material 306 deposited in hole 304 and a conductive material 308 is formed within the hole formed through the dielectric material 306 deposited in hole 304, forming the concentric reference structure. The conductive material 308 is deposited such that it does not contact the conductive semiconductor substrate core 302.

Further illustrated in FIG. 3, a dielectric material 310 is used to fill the PTH hole. Dielectric material 310 is typically a material having a low permittivity that is more easily drilled through laser drilling methods than materials such as glass fiber reinforced epoxy resins and is deposited in the hole using standard semiconductor packaging techniques, such as for example, squeegee printing or stencil printing with squeegee. This dielectric or insulative material may be the same as the dielectric material 306 used to deposit on the surfaces of the conductive semiconductor substrate core 302 as well as initially deposited in the hole 304, or it may be of a different composition. FIG. 3 also illustrates, a pair of holes are then formed through the dielectric plug 310 using processes well understood such as mechanical drilling processes or laser drilling processes, depending on the dimensions of the hole to be created. The second pair of holes are co-axially aligned with the hole 304 and with each other. Conductive material is deposited in the pair of holes having been formed co-axially aligned with hole 304 through the dielectric plug 310, and capped with the same conductive material to form the through vias, i.e., PTHs, 312. Capping typically is done as part of a patterning process. Conducting materials include metals such as copper, aluminum, and tungsten. The conducting material may be deposited, by way of example, in the hole for PTH 112 by PVD, ECD, or electrical plating, for example.

FIG. 3 also illustrates, in diagrammatic form, a cut-away side view of another fabrication process of an insulating semiconductor substrate core having a coaxial structure that includes a concentric reference structure and a pair of signal PTH formed therein, in accordance with at least one embodiment. In FIG. 3, one or more hole(s) 304 is formed in the insulating substrate core 302. Formation of the hole 304 may take place through the use of a device which may include a mechanical means, such as a mechanical drill, or an electromagnetic device, such as a laser for ablating substrate material. The hole 304 through the insulating substrate core 302 may be further formed by way of a chemical etching process, such as a plasma etching process, the specifics of which are appreciated by those of ordinary skill in the art and are not further described herein. The hole 304 has an inner surface spanning from one side of the insulating substrate core 302 to the opposite side of the insulating substrate core 302. As further illustrated in FIG. 3, following the formation of the hole 304 in the insulating substrate core 302, a dielectric material 306 is used to fill the hole 304. Dielectric material 306 is typically a material having a low permittivity that is more easily drilled through laser drilling methods than materials such as glass fiber reinforced epoxy resins and is deposited in the hole using standard packaging techniques, such as for example, squeegee printing or stencil printing with squeegee. The upper and lower surfaces of the insulating substrate core 302 are also laminated using a dielectric or insulative material. This dielectric or insulative material may be the same as the dielectric material 306 used to fill hole 304, or it may be of a different composition.

Following the deposition of the dielectric material 306 into hole 304 and on the surfaces of substrate core 302, the concentric reference structure 308' is created by forming the ring or holes through the dielectric material 306 used to fill the hole 304 and apply to the surface of substrate core 302. Conductive material is deposited in the concentric reference structure using processes well understood by those of ordinary skill in this art. Subsequent to forming the concentric reference structure 308', FIG. 3 also illustrates, a pair of holes are then formed through the dielectric material 306 used to fill the hole 304 and disposed on the surface of substrate core 302 using processes well understood such as mechanical drilling processes or laser drilling processes, depending on the dimensions of the hole to be created. The second pair of holes are co-axially aligned with the hole 304 and the concentric reference structure 308', as well as with each other. Conductive material is deposited in the pair of holes having been formed co-axially aligned with hole 304' through the dielectric material 306 used to fill hole 304, and capped with the same conductive material to form the PTHs 312. Capping typically is done as part of a patterning process. Conducting materials include metals such as copper, aluminum, and tungsten. The conducting material may be deposited, by way of example, in the hole for PTH 312 by PVD, ECD, or electrical plating, for example.

FIG. 4A illustrates, in flow chart form, a fabrication process 400 of a conductive semiconductor substrate core having a coaxial structure that includes a concentric reference structure and a pair of signal PTH formed therein, in accordance with at least one embodiment. In FIG. 4A, box 402, a conductive semiconductor substrate core is provided and one or more holes are drilled through the insulative semiconductor substrate core. A dielectric material is deposited in the hole formed in the conductive semiconductor substrate core and on the surface of the conductive semiconductor substate core (box 404). A hole is formed in the dielectric material deposited in the hole formed in the conductive semiconductor substrate core (box 406). A conductive material is then deposited over the inside surface of the hole or holes (box 408) forming the concentric reference structure. A dielectric plug is then deposited into the hole having the conductive material deposited therein (box 410). A pair of coaxially aligned holes are then formed through the dielectric plug. A conductive material is deposited into the holes formed in the dielectric plug using industry standard techniques such as PVD and ECD techniques for metals, and a coaxial pair of PTH is formed within the dielectric plug in the hole (box 412).

FIG. 4B illustrates, in flow chart form, a fabrication process 414 of a conductive semiconductor substrate core having a coaxial structure that includes a concentric reference structure and a pair of signal PTH formed therein, in accordance with at least one embodiment. In FIG. 4B, box 416, a conductive semiconductor substrate core is provided and one or more holes are drilled through the insulative semiconductor substrate core. A dielectric material is deposited in the hole formed in the conductive semiconductor substrate core and on the surface of the conductive semiconductor substate core (box 418). A hole is formed in the dielectric material deposited in the hole formed in the conductive semiconductor substrate core (box 406). The concentric reference structure is next formed by boring or trenching holes in the dielectric material placed in the hole (box 420). A pair of coaxially aligned holes are then formed through the dielectric plug. A conductive material is deposited into the holes formed in the dielectric plug using industry standard techniques such as PVD, ECD, and conductive ink-fill techniques for metals, and a coaxial pair of PTH is formed within the dielectric plug in the hole (box 422).

Figures 5, 6, 7:
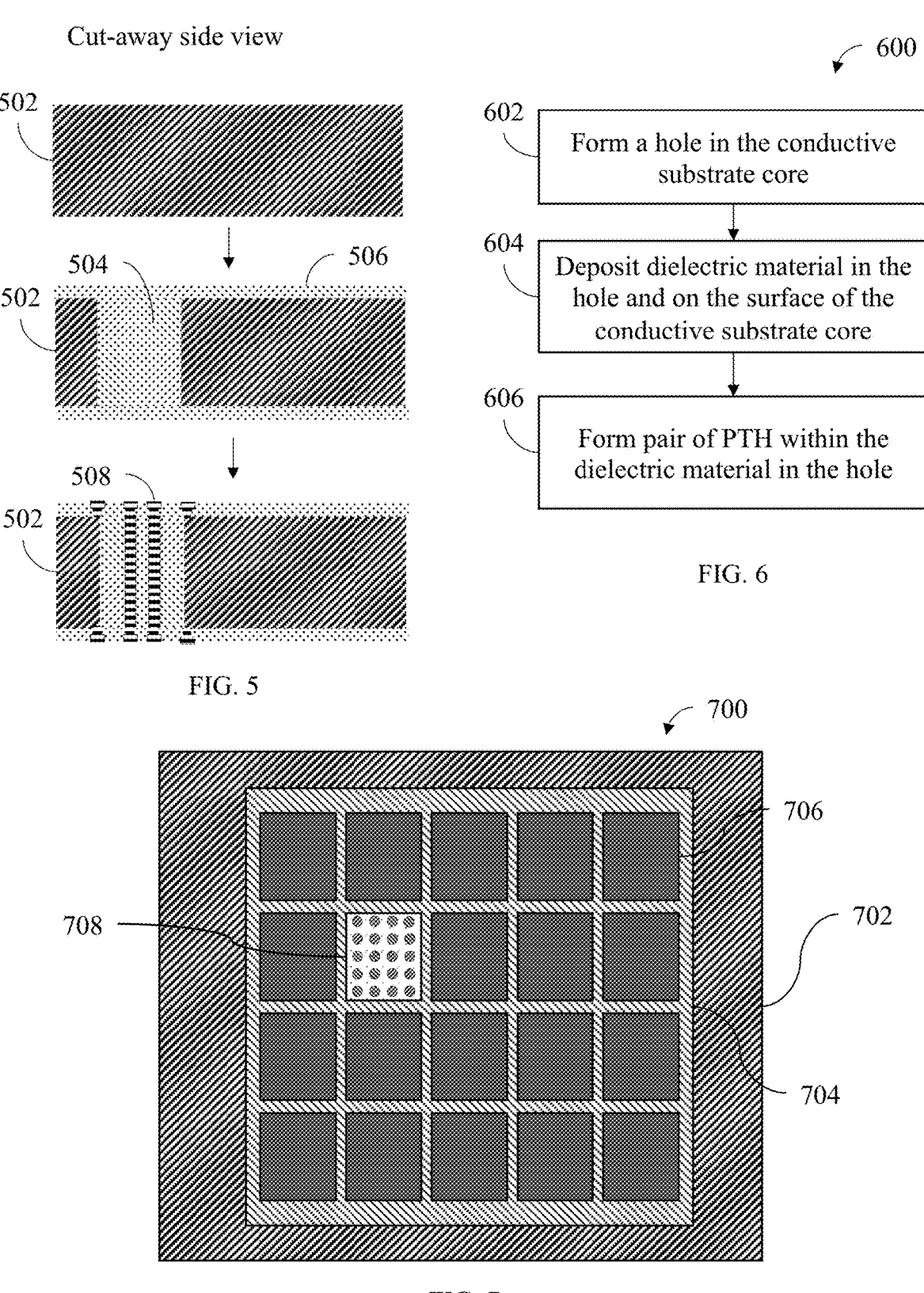
FIG. 5 illustrates, in diagram form, a cut-away side view of a fabrication process of a conductive semiconductor substrate coaxial structure that includes a concentric reference structure and a pair of signal PTH formed therein with the conductive core as the reference, in accordance with at least one embodiment.
FIG. 6 illustrates, in flow chart form, a fabrication process of a conductive semiconductor substrate coaxial structure that includes a concentric reference structure and a pair of signal PTH formed therein with the conductive core as the reference, in accordance with at least one embodiment.
FIG. 7 illustrates, in diagram form a top view of a semiconductor substrate core having a cavity having a PTH rectangular region formed therein, in accordance with at least one embodiment.

FIG. 5 illustrates, in diagram form, a cut-away side view of a fabrication process of a conductive semiconductor substrate core having a coaxial pair PTH formed therein with the conductive core as the reference, in accordance with at least one embodiment. In FIG. 5, a hole 504 is formed in the conductive semiconductor substrate core 502. The hole 504 has an inner surface spanning from one side of the conductive semiconductor substrate core 502 to the opposite side of the conductive semiconductor substrate core 502. Dielectric material 506 is then deposited both in the hole 504 and on the surface of the conductive semiconductor substrate core 502. FIG. 5 also illustrates, a pair of holes are then formed through the dielectric material deposited in hole 504 using processes well understood such as mechanical drilling processes or laser drilling processes, depending on the dimensions of the hole to be created. The pair of holes are co-axially aligned with the hole 504 and with each other. Conductive material is deposited in the pair of holes having been formed co-axially aligned with hole 504 through the dielectric material 506, and capped with the same conductive material to form the PTH 508. Capping typically is done as part of a patterning process. Caps are also formed to connect to the conductive semiconductor substrate so that the conductive semiconductor substrate core may be utilized as the reference for the coaxial pair. Conducting materials include metals such as copper, aluminum, and tungsten. The conducting material may be deposited, by way of example, in the hole for PTH 508 by PVD, ECD, or electrical plating, for example.

FIG. 6 illustrates, in flow chart form, a fabrication process of a conductive semiconductor substrate core having a coaxial pair PTH formed therein, in accordance with at least one embodiment. In FIG. 6, box 602, a conductive semiconductor substrate core is provided and one or more holes are drilled through the insulative semiconductor substrate core. A dielectric material is deposited in the hole formed in the conductive semiconductor substrate core and on the surface of the conductive semiconductor substate core (box 604). A pair of coaxially aligned holes are then drilled through the dielectric material in the formed hole. Metal is deposited into the holes using industry standard techniques such as PVD, ECD, conductive ink-fill techniques for metals, and a coaxial pair of PTH is formed within the dielectric plug in the hole (box 606).

Typically, package core substrates (e.g., thick package core substrates, such as laminate core substrates) are comprised of glass fiber or glass cloth filled epoxide. The typical thickness of the core substrates useful in the present invention is 100 to 1200 μm, or 250 to 1000 μm.

Mechanical drilling to form holes in package substrates can be performed, for example, using mechanical drill bits and by water drilling and sand blasting techniques. Laser drilling to form vias can be performed, for example, using an excimer laser, an ultraviolet (UV) laser, or a $CO_2$ laser. More generally, any type of laser that is suitable for the process of via formation may be used to form vias.

In general, low permittivity materials are materials that do not contain glass fiber or other materials that can cause laser diffraction. Exemplary low permittivity filler materials include epoxy resin film polyimide (PI), and epoxy resin with silicon filler available.

Conducting materials include, for example, metals such as copper and aluminum. Standard semiconductor techniques are employed to deposit metals in holes and form caps. For example, techniques such as PVD (also known as sputtering), ECD, and electrical plating are employed.

Holes formed, do not necessarily have to be circular in shape when viewed from above, they may also be elliptical, for example. Advantageously, embodiments of the present invention are not limited to holes having a particular shape.

Traditionally, PTHs are formed in the core of the package substrate. In package and boards with devices embedded in the cavity formed in the substrate core, e.g., capacitors, inductors, active chips, etc., traditional PTH will be required to remain outside of the cavity region. These PTHs can be grouped to form an island amidst embedded devices or be formed as alleys or donuts under the PHY region of the surface mounted chip. These PTHs can also be used to remove heat from hotspots of the surface mounted/embedded device. These PTHs could also be pre-formed as modules and embedded along with the other devices, as further discussed below.

FIG. 7 illustrates, in diagram form a top view of a semiconductor substrate core 700 having a cavity having a PTH rectangular region formed therein, in accordance with at least one embodiment. Semiconductor substrate core 700 includes a substrate core 702. Substrate core 702 includes a cavity 704 with embedded devices 706. As discussed earlier, embedded devices may include capacitors, inductors, active semiconductor chips, and the like. PTH rectangular region 708 allows for utilization of this region through the cavity to reduce the IO routing length and improve performance associated with shorter routing distances.

Figure 8:
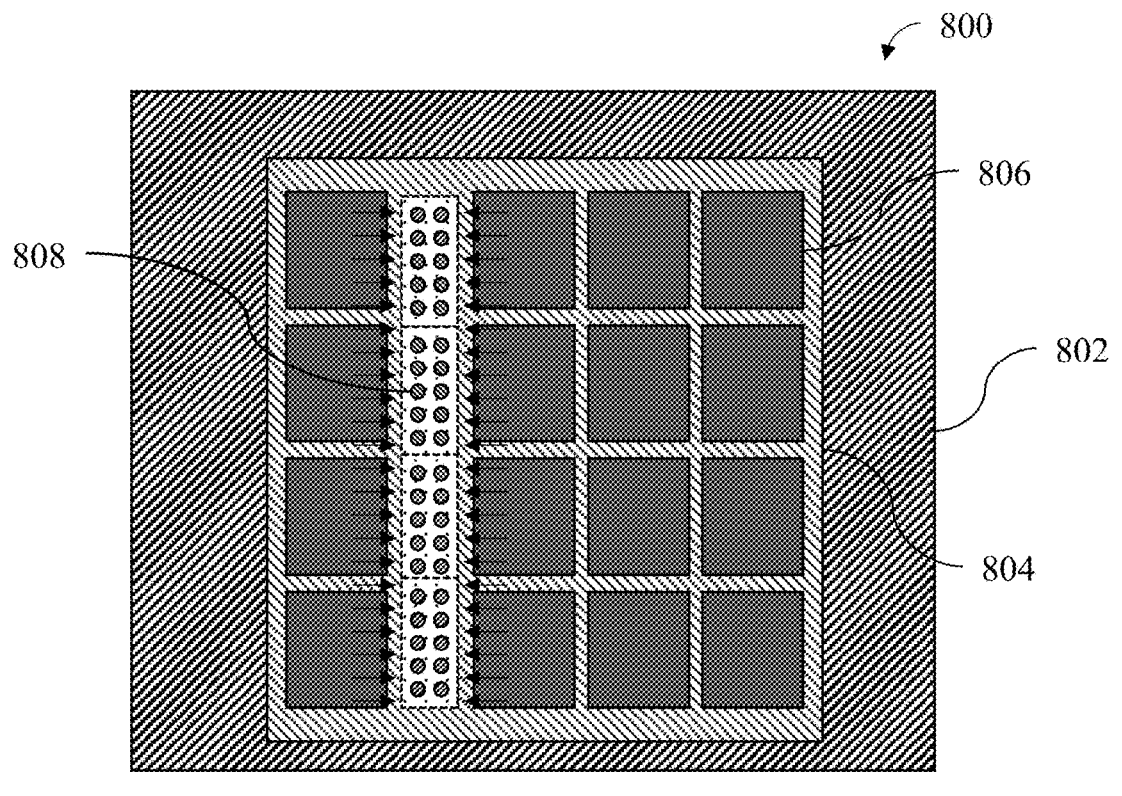
FIG. 8 illustrates, in diagram form, a top view of a semiconductor substrate core having a cavity having a PTH alley region formed therein, in accordance with at least one embodiment.

FIG. 8 illustrates, in diagram form, a top view of a semiconductor substrate core 800 having a cavity having a PTH alley region formed therein, in accordance with at least one embodiment. Semiconductor substrate core 800 includes a substrate core 802. Substrate core 802 includes a cavity 804 with embedded devices 806. As discussed earlier, embedded devices may include capacitors, inductors, active semiconductor chips, and the like. PTH alley region 808 allows for utilization of this region through the cavity to reduce the IO routing length and improve performance associated with shorter routing distances.

FIG. 9 illustrates, in diagram form, a vertical interconnect module 900 for use in a semiconductors substrate core having a PTH region formed therein, in accordance with at least one embodiment. Vertical interconnect module 900 may be fabricated and pre-formed using any of the previously mentioned methods. Vertical interconnect module 900 includes at least one vertical conductor or PTH 904 and will comprise an insulative or dielectric material mold 902. Advantageously, these pre-fabricated, pre-formed interconnect modules 900 may contain arrays of PTHs and be formed to fit into specific X, Y, and Z dimensions, depending on the need. These preformed modules may facilitate integration of fat wires for lower resistance in comparison to traditional PTH that may be fully filled. Such prefab modules may also allow for finer pitch connections, especially in thicker cores. Traditionally, PTH diameter and pitch is limited by core thickness, high aspect ratio PTHs, and substrate manufacturing tolerances. These modules may include a pre-formed interconnect network as part of a conductive frame prior to embedding, e.g., coaxial PTHs, etc. This may allow for materials and structures that may not be compatible with substrate manufacturing flows.

FIG. 10 illustrates, in diagram form, a conductive slug module 1000 for use in a semiconductors substrate core having a conductive slug region formed therein, in accordance with at least one embodiment. Conductive slug module 1000 may be fabricated and pre-formed using any of the previously mentioned methods. Conductive slug module 1000 includes at least one conducting slug 1002 and will comprise an insulative or dielectric material mold 1004. Advantageously, these pre-fabricated, pre-formed interconnect modules 900 may contain arrays of PTHs and be formed to fit into specific X, Y, and Z dimensions, depending on the need. Similar to vertical interconnect module 900, these preformed modules may facilitate integration of fat wires for lower resistance in comparison to traditional PTH that may be fully filled. Such prefab modules may also allow for finer pitch connections, especially in thicker cores. These modules may include a pre-formed interconnect network as part of a conductive frame prior to embedding, e.g., coaxial PTHs, etc. This may allow for materials and structures that may not be compatible with substrate manufacturing flows. Conductive slug module 1000 may be used in cases where fewer interconnects are required, further improving resistance. In each instance, there are exposed metal connections points on multiple sides of the modules to facilitate via connects to packaging RDL.

Figure 11:
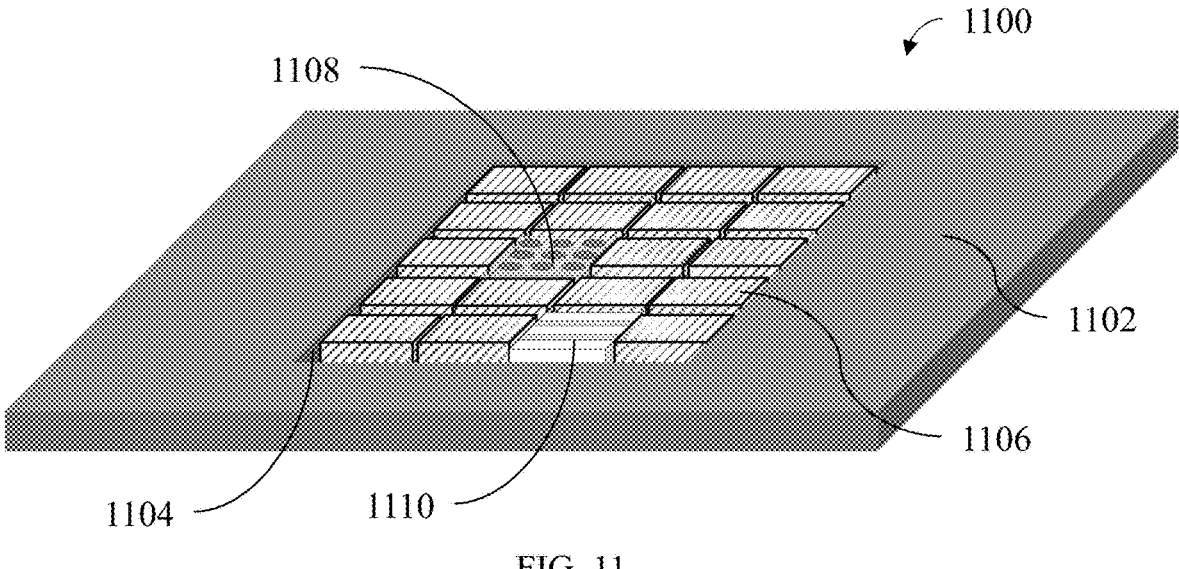
FIG. 11 illustrates, in diagram form, a semiconductor substrate core having a cavity including a vertical interconnect module and a conductive slug module utilized therein, in accordance with at least one embodiment.

FIG. 11 illustrates, in diagram form, a semiconductor substrate core 1100 having a cavity including a vertical interconnect module and a conductive slug module utilized therein, in accordance with at least one embodiment. Semiconductor substrate core 1100 includes a substrate core 1102 and a substrate cavity 1104. Substrate cavity 1104 is adapted to include devices 1106 which may include devices such as such as capacitors, capacitor modules, inductors, inductors modules, active devices such as functional semiconductor chips, etc. FIG. 12 illustrates, in diagrammatic form, a cut-away side view of a traditional package substrate 1200 with die mounted atop the substrate, ball connectors on the bottom of the substrate, and devices embedded within the core of the substrate. FIG. 12 illustrate a particular problem with the traditional package or board with devices embedded in a cavity such as the substrate cavity 1104 illustrated in FIG. 11. Traditionally, PTHs are formed in the core of the package. For packages or boards with devices embedded in a cavity formed in the substrate core, e.g., capacitors, inductors, active chips, etc., traditional PTHs are required to remain outside of the cavity region. By way of example only, FIG. 12 illustrates a substrate core 1202 with a cavity region containing devices 1204. Connecting solder ball A to die input/output A' which is above the cavity region requires a route by way of PTH 1206. The path illustrated by PTH 1206 adds additional interconnect length and the concomitant capacitance, resistance, and signally penalties typically associated with lengthier interconnect. Embodiments of the subject matter disclosed herein address this issue in at least three different ways.

First, PTH's may be provided in gap-fill material traditionally used in the cavity of a substrate core and illustrated herein in FIG. 7 and FIG. 8. These structures illustrate the use of PTH's through the cavity region, which may be filled with an insulator, to reduce the signal routing length and provide the concomitant performance improvements. As illustrated, these PTHs may be formed in groups to form islands amidst embedded devices as illustrated in FIG. 7, or formed as alleys under a area with critical timing constraints such as a PHY interface for a surface mounted chip as illustrated in FIG. 8, or be formed into other shapes such as donuts, half moons, and similar geometric shapes. PTYs such as these illustrated in FIG. 7 and FIG. 8 may also be used to remove heat from hotspots of the surface mounted and/or embedded devices.

Secondly, the PTH's may be a pre-formed PTH module such as the vertical interconnect module 900 illustrated in FIG. 9, and may be picked, placed, and embedded in the cavity of a substrate core along with other devices. Forming vertical interconnect module 900 with various diameter PTHs provides for the use of 'fat' wires for facilitating interconnect with lower resistance in comparison to traditional PTH which may not be fully filled with conductive material. Such prefabricated modules may also provide for finer pitch connections, specifically in thicker substrate cores. As is understood, traditionally, PTH diameter and pitch may be limited by substrate core thickness, high aspect ratio PTHs, and substrate core manufacturing tolerances. Additionally, these modules may include pre-formed interconnect network prior to embedding, i.e., as part of a conductive frame such as Coaxial PTHs. This may facilitate the use of materials and structures that may not be compatible with substrate manufacturing flows.

Third, the PTH's may be a preformed conductive slug module 1000 illustrated in FIG. 10, and again, may be picked, placed, and embedded in the cavity of a substrate core along with other devices. Conductive slug module 1000 may be used in situations where fewer interconnections are required to further improve resistance characteristics within the package, or to dissipate heat. In both instances, vertical interconnect module 900 and conductive slug module 1000 may be pre-fabricated with exposed metal on multiple sides of the respective modules to facilitate via connections to package RDL.

FIG. 13 illustrates, in diagrammatic form, a cut-away side view of a package substrate 1300 with die mounted atop the substrate, ball connectors on the bottom of the substrate, and adapted to utilize at least a vertical interconnect module 900 or a conductive slug module 1000, in accordance with at least one embodiment. Package substrate core 1300 includes substrate core 1302, device 1304, vertical interconnect module 1306, conductive slug module 1308, and vertical interconnect through the cavity fill material 1310, also illustrated in FIG. 8, PTH alley region 808. As can illustrated, vertical interconnect module 1306 provides for PTHs that are more directly connect solder ball A to die input/output A' which is above the cavity region. Likewise, conductive slug module 1308 provides for improved resistance when connecting solder ball P to die input/output P'.

Thus, it will be apparent to one of ordinary skill that this disclosure provides for improved method and apparatus for use in semiconductor packaging substrates, and in particular to improve the performance and reduce the area utilized by PTHs in semiconductor packaging substrates by utilizing a coaxial approach where signals are routed within a concentric reference conductor within traditional package substrates.

Apparatus, methods and systems according to embodiments of the disclosure are described. Although specific embodiments are illustrated and described herein, it will be appreciated by those of ordinary skill in the art that any arrangement which is calculated to achieve the same purposes can be substituted for the specific embodiments shown. This application is intended to cover any adaptations or variations of the embodiments and disclosure. For example, although described in terminology and terms common to the field of art, exemplary embodiments, systems, methods and apparatus described herein, one of ordinary skill in the art will appreciate that implementations can be made for other fields of art, systems, apparatus or methods that provide the required functions. The invention should therefore not be limited by the above-described embodiment, method, and examples, but by all embodiments and methods within the scope and spirit of the invention.

In particular, one of ordinary skill in the art will readily appreciate that the names of the methods and apparatus are not intended to limit embodiments or the disclosure. Furthermore, additional methods, steps, and apparatus can be added to the components, functions can be rearranged among the components, and new components to correspond to future enhancements and physical devices used in embodiments can be introduced without departing from the scope of embodiments and the disclosure. One of skill in the art will readily recognize that embodiments are applicable to future systems, future apparatus, future methods, and different materials.

All methods described herein can be performed in a suitable order unless otherwise indicated herein or otherwise clearly contradicted by context. The use of any and all examples, or exemplary language (e.g., "such as"), is intended merely to better illustrate the disclosure and does not pose a limitation on the scope of the disclosure unless otherwise claimed. No language in the specification should be construed as indicating any non-claimed element as essential to the practice of the disclosure as used herein.

Terminology used in the present disclosure is intended to include all environments and alternate technologies that provide the same functionality described herein.

What is claimed is:

1. A method of forming a cylindrical coaxial structure in a conductive semiconductor substrate core having a first substantially planar first surface and an second substantially planar second surface substantially parallel to said first surface and spaced therefrom by a first predefined thickness, said method comprising the steps of:

depositing a first dielectric layer comprising a first selected dielectric material on said first surface of said substrate core, said first dielectric layer having a third substantially planar surface in contact with at least a selected first portion of the first surface of the substrate core and a fourth substantially planar surface having at least a selected second portion substantially parallel to, and generally aligned with, said first portion of said third surface and spaced therefrom by a second predetermined thickness;

depositing a second dielectric layer comprising a second selected dielectric material on said second surface of said substrate core, said second dielectric layer having a fifth substantially planar surface in contact with at least a selected third portion of the second surface of the substrate core and generally aligned with the second portion of said first dielectric layer, and a sixth surface having at least a selected fourth portion substantially parallel to, and generally aligned with, said third portion of said fifth surface and spaced therefrom by a third predetermined thickness;

forming a first cylindrical hole through said first dielectric layer, said substrate core and said second dielectric layer, said first hole having a first substantially cylindrical inner surface extending:

entirely through said first dielectric layer entirely within said first and second portions of said first dielectric layer;

entirely through said substrate core from said first surface of said substrate core to said second surface of said substrate core; and entirely through said second dielectric layer entirely within said third and fourth portions of said second dielectric layer;

depositing a second selected dielectric material in said first hole to substantially fill said first hole;

forming a second cylindrical hole extending entirely through the second dielectric material in said first hole, said second cylindrical hole having a second substantially cylindrical inner surface substantially coaxial with said first hole and spaced therefrom by a fourth predetermined thickness;

depositing over said second inner surface of said second hole in said second dielectric material a selected electrically conductive material to form a cylindrical reference structure extending:

entirely through said first dielectric layer entirely within said first and second portions of said first dielectric layer;

entirely through said substrate core from said first surface of said substrate core to said second surface of said substrate core; and entirely through said second dielectric layer entirely within said third and fourth portions of said second dielectric layer;

depositing, entirely within said reference structure, a third selected dielectric material to substantially fill said cylindrical reference structure; and forming a first through-via and a second through-via through said third dielectric material in said reference structure, each through-via extending entirely through said reference structure from said fourth surface of said first dielectric layer to said sixth surface of said second dielectric layer;

whereby both the first through-via and the second through-via are entirely within, but electrically isolated from, the reference structure.

2. The method of claim 1 wherein said first dielectric material and said second dielectric material are the same dielectric material.

3. The method of claim 1 wherein said first dielectric material and said second dielectric material are different dielectric materials.

4. The method of claim 1 wherein said forming of said concentric reference structure is by conductive ink-fill techniques.

5. The method of claim 1 wherein said forming of said first and second through via is by conductive ink-fill techniques.

* * * * *